United States Patent [19]

Nakayama et al.

[11] Patent Number: 4,532,378
[45] Date of Patent: Jul. 30, 1985

[54] TELEPHONE APPARATUS CAPABLE OF INPUTTING CHARACTER DATA

[75] Inventors: Yasunobu Nakayama, Tustin, Calif.; Takeshi Kunii; Yasuji Sato, both of Tokyo, Japan

[73] Assignee: Tokyo Shibaura Denki Kabushiki Kaisha, Kawasaki, Japan

[21] Appl. No.: 637,343

[22] Filed: Aug. 3, 1984

Related U.S. Application Data

[63] Continuation of Ser. No. 378,730, May 17, 1982, abandoned.

[30] Foreign Application Priority Data

May 28, 1981 [JP] Japan .................................. 56-80100

[51] Int. Cl.³ ......................................... H04M 11/06
[52] U.S. Cl. .............................. 179/2 DP; 179/84 VF
[58] Field of Search ............... 179/2 A, 2 C, 2 DP, 179/84 VF

[56] References Cited

U.S. PATENT DOCUMENTS

| | | | |
|---|---|---|---|
| 3,675,513 | 7/1972 | Flanagan et al. | 179/84 VF |
| 3,932,709 | 1/1976 | Hoff et al. | 179/2 DP X |
| 4,012,599 | 3/1977 | Meyer | 179/84 VF |
| 4,223,183 | 9/1980 | Peter, Jr. | 179/2 DP |
| 4,427,848 | 1/1984 | Tsakanikas | 179/2 DP |

FOREIGN PATENT DOCUMENTS 002247 of 1979 European Pat. Off. .
WO80/80005-17 of 1980 PCT Int'l Appl. .
1345328 of 1974 United Kingdom .

OTHER PUBLICATIONS

Pavlak et al., "Keypac-A Telephone Aid for the Deaf", *IEEE Transactions on Communications*, vol. 20, Com-27, No. 9, Sep. 1979, pp. 1366-1371.
Sederholm et al., "Intelligent Telephone," *IBM Technical Disclosure Bulletin*, vol. 23, No. 9, Feb. 1981, pp. 4006-4008.

*Primary Examiner*—Keith E. George
*Attorney, Agent, or Firm*—Cushman, Darby & Cushman

[57] ABSTRACT

A telephone apparatus which can input character/symbol data. The apparatus has a keyboard including a plurality of numeral keys each assigned to characters/symbols, a mode change key for switching numerical mode to character/symbol mode, or vice versa and a special key for executing a predetermined sequence. After the apparatus has been set to the character/symbol mode, the numeral keys assigned for the characters/symbols and the special key are operated in the predetermined sequence, thereby inputting character/symbol data. The data are applied to a electronic calculator CPU, are outputted in the form of character/symbol pattern signals from a character generator, and are displayed by a display section in the predetermined sequence.

4 Claims, 9 Drawing Figures

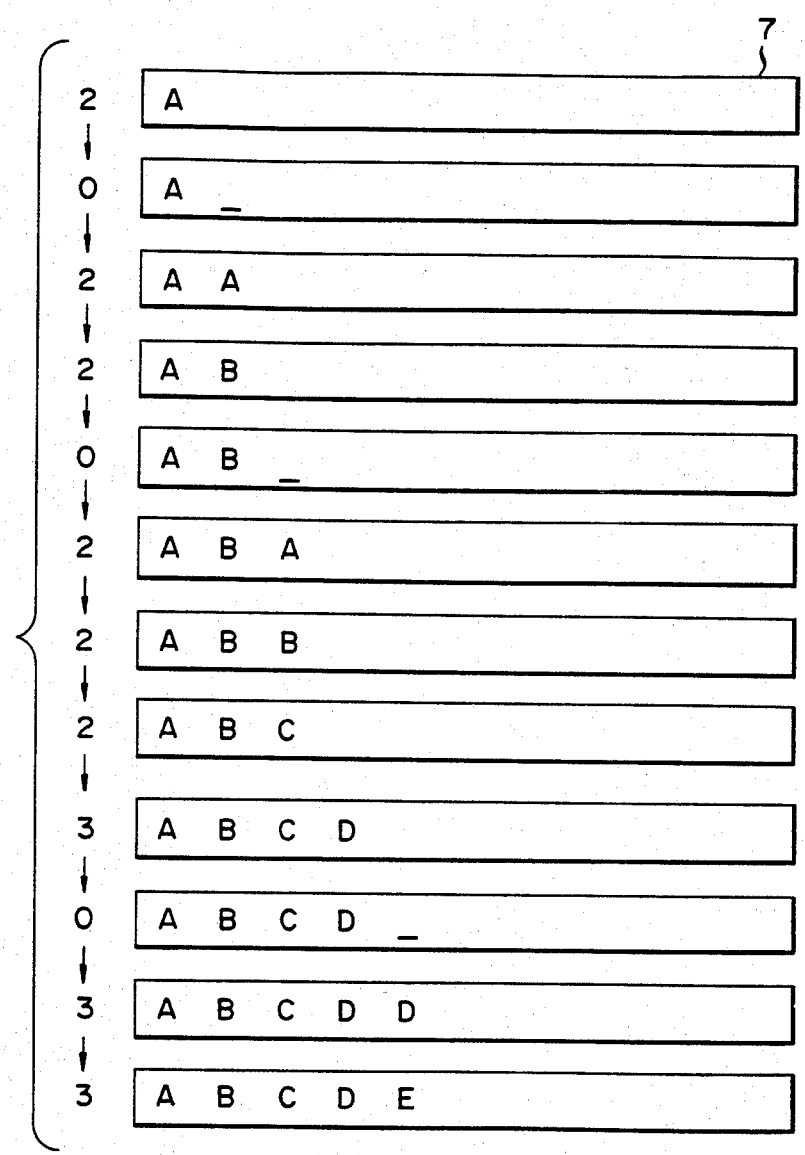

TELEPHONE APPARATUS CAPABLE OF INPUTTING CHARACTER DATA

This is a continuation, of application Ser. No. 378,730, filed May 17, 1982, now abandoned.

BACKGROUND OF THE INVENTION

The present invention relates to a telephone apparatus, and more particularly to a telephone apparatus which can input character data by operating the numeral keys of the conventional keyboard.

The conventional telephone has a keyboard having numeral keys for inputting telephone numbers. In order to input character data through the telephone, the telephone must be provided with a keyboard having character keys in addition to numeral keys.

SUMMARY OF THE INVENTION

It is an object of the present invention to provide a telephone apparatus which has a keyboard including numeral keys and two or more additional keys and which can input character data by operating the numeral keys and the additional keys in a prescribed sequence.

In order to achieve the above-mentioned object, there is provided according to the invention a telephone apparatus capable of inputting character data as well as numeral data, comprising telephone network means connected to a handset and terminals connected to a telephone exchange station; a keyboard means having a sequence start key, numeral keys each assigned to a plurality of characters/symbols, special key for executing a sequence, a sequence end key and a mode switching key for switching a numeral mode to a character/symbol mode and vice versa; a controller means connected to the telephone network means and the keyboard for outputting character/symbol pattern signals in a predetermined sequence, said controller means being comprised of means connected to the keyboard means for setting desired mode as the mode switching key is operated; first character/symbol selecting means connected to the keyboard means for selecting one of characters/symbols assigned to the numeral keys by operating the key assigned to the character/symbol selected, after the mode setting means has been set to the character/symbol mode and for outputting a character/symbol pattern signal representing character/symbol selected; and second character/symbol selecting means connected to the keyboard means for holding the character/symbol pattern signal from the first character/symbol selecting means, selecting another character/symbol than the character/symbol selected by the first character/symbol selecting means, said other character/symbol being assigned to the same key, by operating the same key and then operating the special key for executing a sequence and for outputting a character/symbol pattern signal representing said other character/symbol selected. In one embodiment of the present invention, the first character/symbol selecting means selects a plurality of characters/symbols assigned to the any desired numeral key one by one upon depressing of the desired numeral key thus assigned for the characters/symbols and outputs character/symbol pattern signals representing the characters/symbols thus selected. The second character/symbol selecting means holds a character/symbol pattern signal outputted from the first character/symbol selecting means, selects another character/symbol by operating the same numeral key and then the special key for executing a predetermined sequence and then outputs a character/symbol pattern signal representing the other character/symbol thus selected.

Since the telephone apparatus of the present invention is thus constructed, it can output the desired character/symbol pattern signal by operating one of numeral keys assigned to a plurality of characters of symbols and two or three additional keys in a predetermined sequence and by executing the predetermined sequence by means of a controller containing a microcomputer in response to the keying operation. Therefore, the telephone apparatus according to the invention can input character/symbol data without parts and components such as a keyboard in addition to the ordinary keyboard and thus without being complicated.

BRIEF DESCRIPTION OF THE DRAWINGS

FIG. 7 is a view showing the transfer of the display on the display section of a character pattern signal upon keying of the keyboard in accordance with the flowchart shown in FIGS. 6A and 6B.

DETAILED DESCRIPTION OF THE PREFERRED EMBODIMENTS

The present invention will now be described in more detail with reference to the accompanying drawings.

Figure 1:
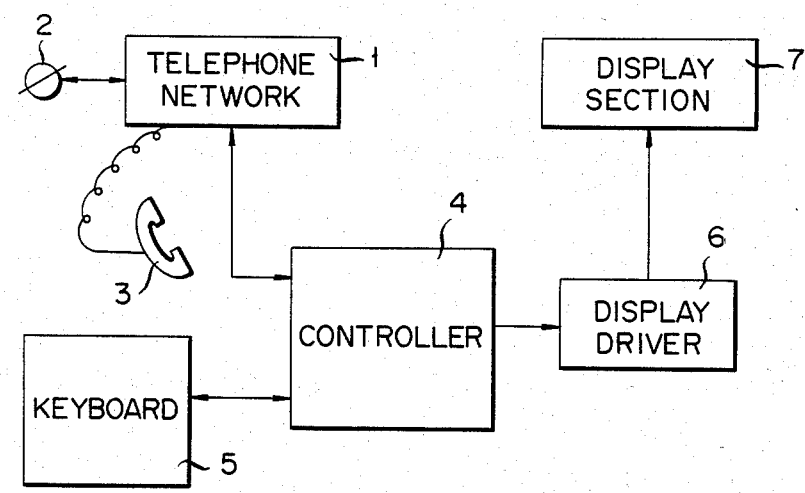
FIG. 1 is a block circuit diagram schematically showing the general construction of the telephone apparatus according to the present invention.

As shown in FIG. 1, a telephone network 1 is connected to a terminal 2 connected to a central telephone exchange to a handset 3 and further to a controller 4. The controller 4 receives an input signal from a keyboard 5 upon keying operation, executes a sequence in accordance with a predetermined flowchart, sequentially outputs a character/symbol pattern signal, and displays the character/symbol through a display driver 6 on a display section 7.

The telephone network 1 may, for example, use a conventional network as disclosed in FIG. 10 on page IV-6 of a reference entitled "TELECOMMUNICATION DATA BOOK" (issued in March, 1981 by MOSTEK Corporation).

Figure 2:
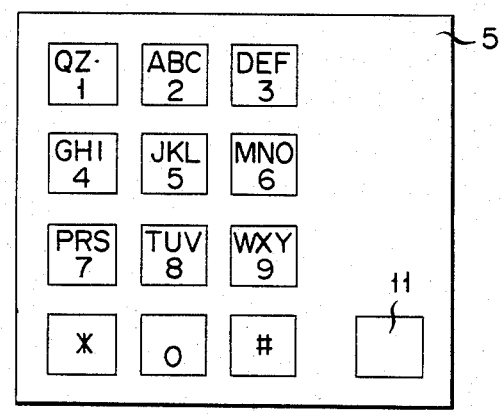
FIG. 2 is a plane view showing the arrangement of the keys of the keyboard shown in FIG. 1.

In the keyboard 5, a plurality (three each) of characters/symbols are respectively assigned for 1 key to 9 key of the numeral keys as shown in FIG. 2. The characters Q and Z and the symbol (.) are assigned for the 1 key. A, B and C are assigned for the 2 key, D, E and F are assigned for the 3 key, G, H and I are assigned for the 4 key, J, K and L are assigned for the 5 key, M, N and O are assigned for the 6 key, P, R and S are assigned for the 7 key, T, U and V are assigned for the 8 key, and W, X and Y are assigned for the 9 key, respectively. The 0 key of the numeral keys is used as a special key for executing a predetermined sequence, and no character is assigned for the 0 key. There are further on the keyboard 5 a     key as a start key to be depressed when the execution of a sequence is started, a # key as an end key to be depressed when the execution of the sequence is finished, and a mode change key 11 to be depressed when the numeral mode and the character/symbol mode are switched.

Figure 3:
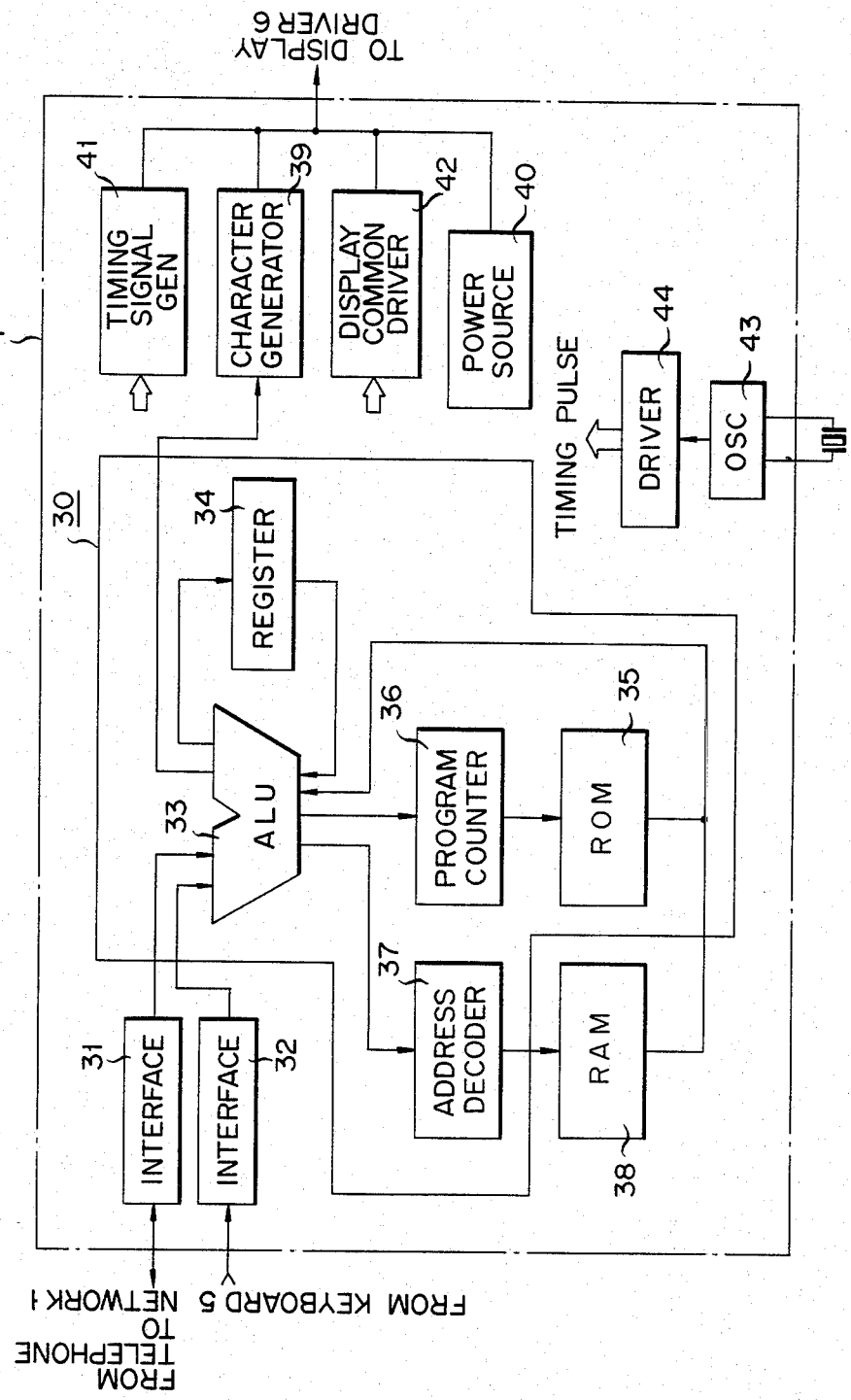
FIG. 3 is a concrete circuit arrangement showing one preferred embodiment of a controller shown in FIG. 1.

The controller 4 has mainly, as shown in FIG. 3, a schedule electronic calculator CPU 30, which will hereinafter be abbreviated to as "CPU", as one chip, and may preferably employ, for example, MEMO-NOTE T6027 (trade name). As identified from FIG. 3, the CPU 30 has an arithmetic and logical unit, which will be hereinafter abbreviated as to "ALU", to which a signal from the telephone network 1 and a signal inputted by keying from the keyboard 5 are respectively inputted through interfaces 31 and 32. The CPU 30 further has a register 34 so connected across the ALU 33 as to input and output a signal for allowing the ALU 33 to judge or detect the depressing of the prescribed key of the keyboard 5, a ROM 35 for storing a program table, a program counter 36 connected between the ALU 33 and the ROM 35 for executing the content of the program one step by one step and generating a counted output, and an address decoder 37 for converting a data inputted to the ALU 33 into a decode signal for designating an address by the keying operation of the keyboard 5. The output from the address decoder 37 is in turn inputted to a RAM 38 separately provided from the CPU 30. The data inputted to the predetermined address of the RAM 38 and the data outputted from the ROM 33 are in turn inputted to the ALU 33. In the controller 4, the data according to the program sequence upon keying of desired key judged by the ALU 33 is converted into a character/symbol pattern signal by a character generator 39, and is then displayed through the display driver 6 on the display section 7. The character generator 39 is driven by a power source 40 and is connected to a timing signal generator 41. In the controller 4 is further provided a display common driver 42 for driving the display common of the display section 7 when the output from the character generator 39 is displayed as a character/symbol pattern on the display section 7. In the controller 4 are further provided an oscillator 43 for supplying a timing pulse for a predetermined constituent, and a driver 44 for driving the timing pulse from the oscillator 43.

One example of the execution of the sequence of the present invention will be described in accordance with the flowchart shown in FIGS. 4A and 4B with reference to the display mode in FIG. 5.

Figure 4A:
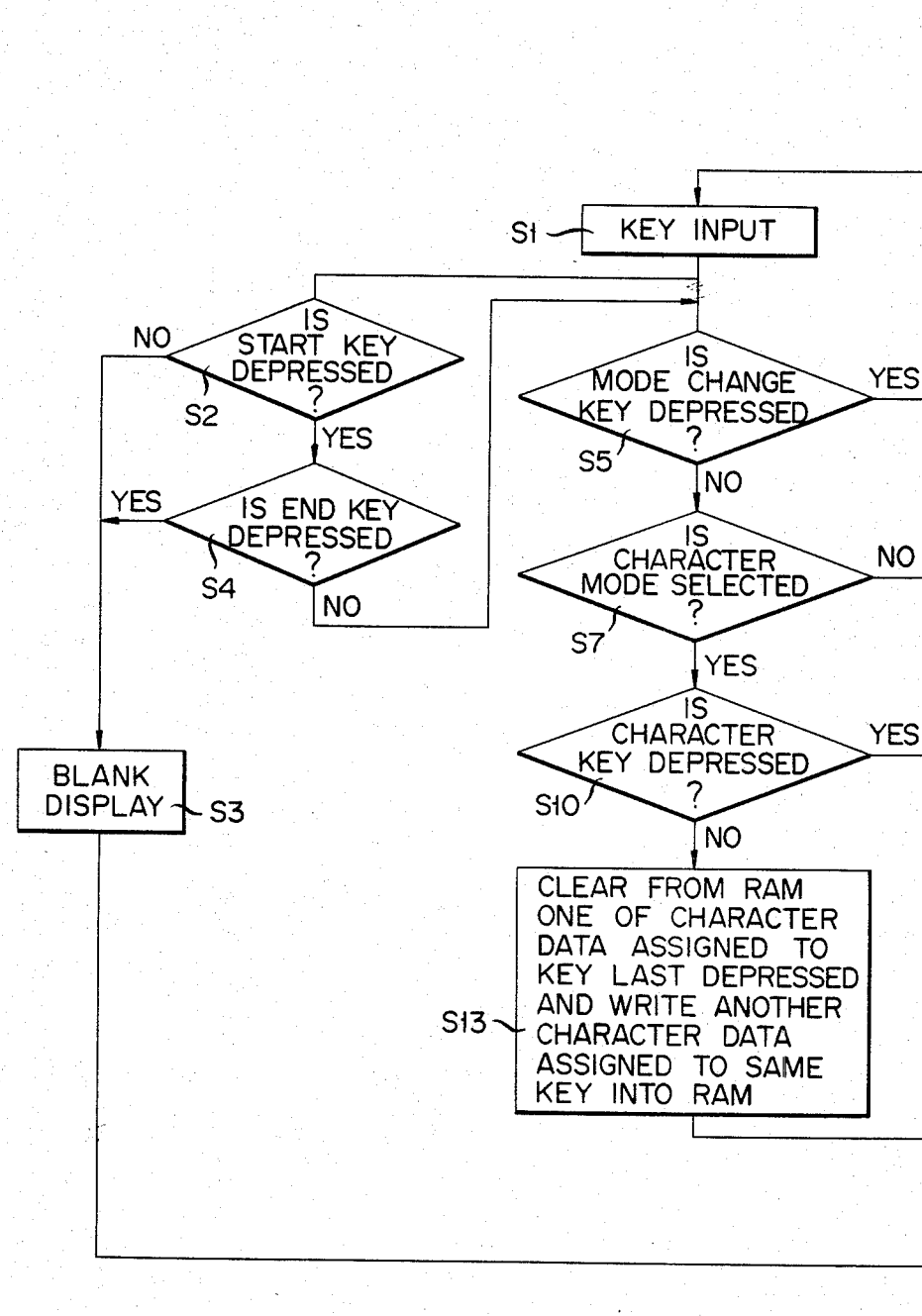
FIGS. 4A and 4B are a flowchart showing one embodiment of the telephone apparatus for describing the execution of one sequence of the apparatus by keying operation.
Figure 4B:
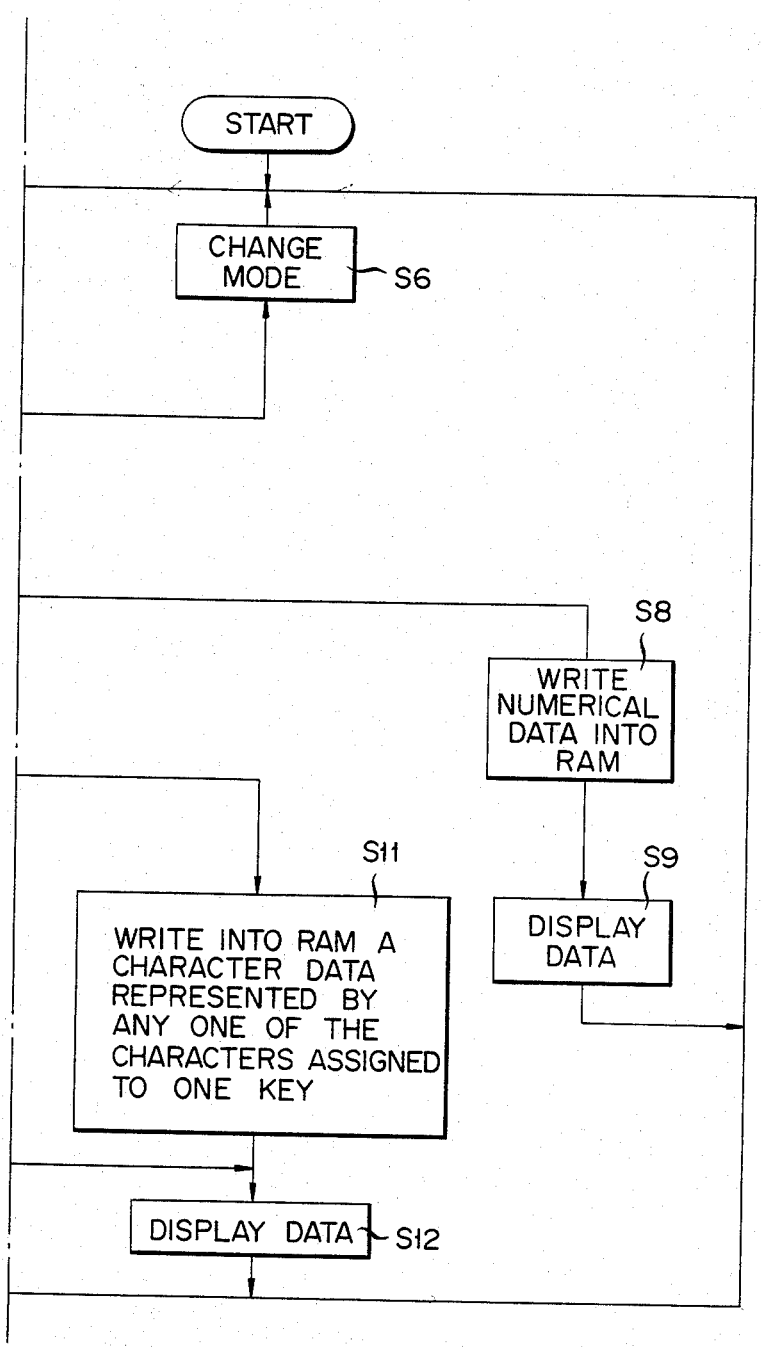

When the driving operation is started as shown in FIGS. 4A and 4B and data is inputted by keying of the keyboard 5, the key input is detected in the step S1. Whether or not the key input data is obtained by the depression of the     key of the start key is judged in the step S2. When the judgement in the step S2 is not the depression of the     key, the operation is branched to "NO", and a blank display is carried out in the step S3. When the judgement in the step S2 is the depression of the     key, the operation is advanced to the step S4. In the step S4 whether or not the keying operation was the depression of the # key of the end key. When the judgement in the step S4 is the depression of the # key, the operation is branched to "YES", and the blank display is carried out in the step S3. When the operation is branched to "NO", whether or not the keying operation was the depression of the mode change key 11 is judged in the step S5. When the judgement in the step S5 is "YES", the operation is advanced to the step S6, the mode is changed, and next keying operation will be waited. When the judgement in the step S5 is not the depression of the mode change key 11, the operation is branched to "NO", and whether or not the present mode is character mode is judged in the step S7. When the judgement in the step S7 is "NO", the operation is advanced to the step S8, and a flow of writing numerical data into the RAm 38 from the CPU 30 shown in FIG. 3 by the keying operation is executed. The numeral data thus written into the predetermined address of the RAM 38 is fed from the ALU 33 to the character generator 39 in accordance with the content of the sequence table stored in the ROM 35, is then converted at the generator 39 into a character/symbol pattern signal, is numerically displayed through the display driver 6 on the display section 7, and the step S9 is then executed. When the character mode is judged in the step S7, the flow is branched to "YES", and whether or not the key depressed in the step S10 is character key is judged in the step S10. In the judgements of the above-described steps, the data inputted by the keying operation is applied to the ALU 33 in the CPU 30, the data is circulated with the register 34, and whether the data is as desired or not is judged according to whether or not there is a flag in the predetermined bit location of the register 34. When the character mode is judged in the step S10, the flow is branched to "YES", and is advanced to the step S11, and special one character/symbol data of the character assigned for the depressed key is written through the ALU 33 and the address decoder 37 into the predetermined address of the RAM 38. The character/symbol data thus written into the RAM 38 is displayed on the display section 7 through the execution in the step S12 in the same manner as described above. In the example of the keys in the keyboard 5 shown in FIG. 2, the character/symbol at the leftmost end assigned for the respective keys may be initially displayed after the character mode is judged as described above.

When the judgement in the step S10 is not the depression of the character/symbol key, the flow is advanced to the step S13, and is branched to "NO". The depression of the key at this time corresponds to the operation of the 0 key as a special key, the character/symbol assigned to the rightward adjacent to the character/-symbol displayed previously of the character assigned to the key depressed previously is read from the ROM 35 shown in FIG. 3 in the step S13 in accordance with the addressing by the operation of the 0 key, and is displayed on the display section 7. A plurality of characters/symbols assigned to one key are sequentially selected rightwardly from the leftmost end every time the 0 key is depressed, the character/symbol of the rightmost end is returned to the character/symbol of the leftmost end again, and is thus displayed.

The sequence of the keying operation of the case that the characters "A, B, C, D, E" in the character/symbol mode are concretely displayed on the display section 7 and the display mode of the display section 7 at every 15 keying operation will now be described with reference to FIG. 5.

Figure 5:
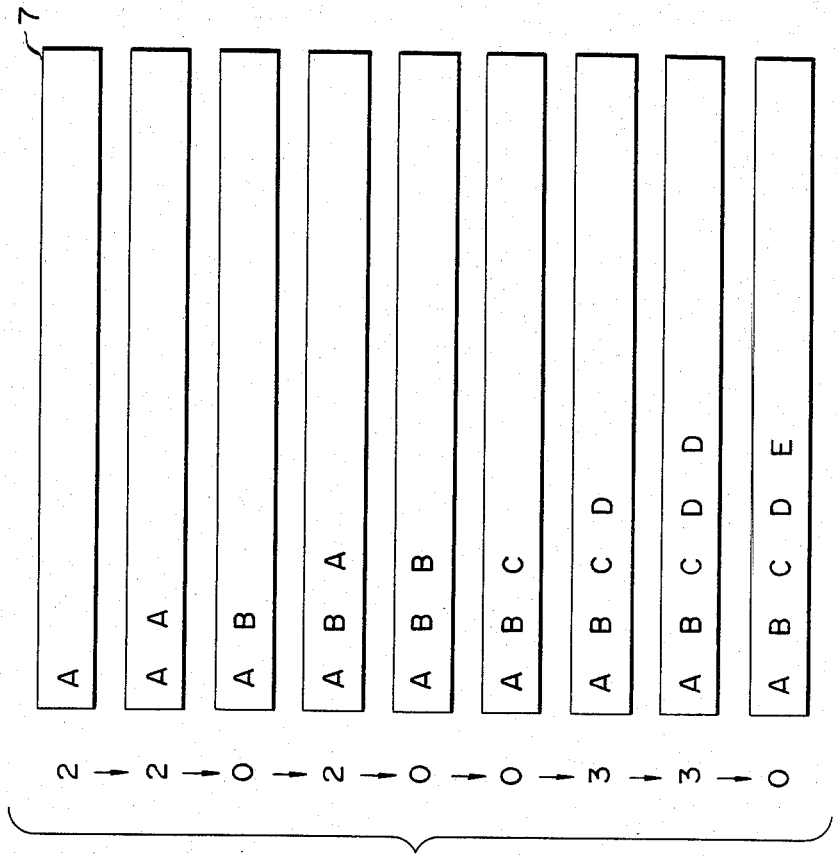
FIG. 5 is a view showing the transfer of the display on the display section of a character pattern signal upon keying of the keyboard in accordance with the flowchart shown in FIGS. 4A and 4B.

In FIG. 5, the numerals at the leftmost end represent the numerals of the numeric keys provided on the keyboard 5 in FIG. 2. FIG. 5 shows the display mode displayed on the display section 7 of the characters assigned to the keys when the numeral keys are depressed. When the key input is detected in the step S1, the mode change key 11 is then depressed and the operation is set in the character/symbol mode, and the 2 key is thereafter depressed, the character A at the leftmost end of the characters A, B, C assigned to the 2 key is displayed on the display section 7. In order to then display the character B, the 2 key assigned for the B is depressed. At this time the character A is displayed consecutive to the character A displayed previously on the display section 7, and "A A" is thus displayed on the display section 7. When the 0 key of the special key is then depressed, the character B is displayed on the display section 7 instead of the A at the right side, and "A B" is thus dislayed on the display section 7. Subsequently, in order to display the character C as an input, the 2 key assigned for the character C is then depressed. In this manner, the character A is displayed consecutive to the "A B" displayed previously on the display section 7. The character B is then displayed instead of the A at the rightmost end by depressing the 0 key, and "A B B" is thus displayed on the display section 7. When the 0 key is again depressed, the character C is displayed instead of the character A at the rightmost end, and "A B C" are displayed on the display section 7. In order to then display the character D, the 3 key assigned for the character D is depressed, and the D is thus displayed consecutive to the "A B C". For the purpose of displaying then the character E, when the 3 key assigned for the E is depressed, the D assigned to the leftmost end of the 3 key is initially displayed, "A B C D D" are thus displayed on the display section 7, and when the 0 key is then depressed, the E is displayed instead of the D at the rightmost end, and "A B C D E" are thus displayed on the display section 7.

The execution of the sequence by the aforementioned keying operation is judged by the operation in which the key input data is applied to the ALU 33 by the keying operation, the execution of the judging step of whether or not the depressed key is as desired is carried out in the register 34, and whether or not there is a flag in the register 34 is judged.

When the key input data is judged as from the desired key depressed, the input data is addressed and stored in the RAM 38, is then read from the ALU 33 in accordance with the program table stored in advance in the ROM 35, is outputted as the corresponding character/symbol pattern signal from the character generator 34, and is thus displayed on the display section 7.

Another example of the execution of the sequence of the present invention will be described in accordance with the flowchart shown in FIGS. 6A and 6B with reference to the display mode in FIG. 7.

The flow of the step S1 to the step S9 after the driving operation is started as shown in FIG. 6 and the data is inputted by the keying operation of the keyboard 5 is the same as that described with reference to the example shown in FIGS. 4A and 4B the step S21 to the step S29 are designated as the corresponding steps in FIGS. 4A and 4B and the description will be omitted. When the character mode is judged in the step S27, the flow is branched to "YES", and whether or not the depressed key is a special key is judged in the step S30. When the depressed key is judged as the special key, a cursor is displayed on the display section 7 in the step S31, the data inputted by the key depressed previously is being displayed in the column of the leftward adjacent to the column displayed with the cursor, and the data inputted by the next keying operation is waited for displaying in the column displayed with the cursor.

On the other hand, when the depressed key is not the special key, the flow is branched to "NO", and whether or not the key depressed in the step S32 is judged as the same as the key depressed previously. When the depressed key is judged as the key assigned for the initial character/symbol, the flow is advanced, when the judgement in the step S32 is "NO", to the step S33, the character/symbol at the leftmost end thus assigned to the key is written into the RAM 38 through the CPU 30, is then outputted as a character/symbol pattern signal from the character generator 39, and is displayed in the predetermined column on the display section 7. When the key depressed this time in the step S32 is judged as being the same as the key depressed previously, the flow is branched to "YES", is then advanced to the step S34, and whether or not the key depressed previously is special key is judged. When the key depressed previously is the special key, the flow is branched to "YES", is then advanced to the step S33, the character/symbol at the leftmost end of the key assigned for the character/symbol to be displayed is stored in the RAM 38, and is displayed in the column displayed with the cursor on the display section 7, and the step S37 is executed. When the key depressed previously in the step S34 is judged as being not the special key, the flow is branched to "NO", is then advanced to the step S35, the character/symbol assigned to the rightward adjacent to the character/symbol displayed previously of the character assigned to the key depressed previously is written into the ROM 35, is outputted as the character/symbol pattern signal from the character generator 39 through the CPU 33, is displayed on the display section 7, and the step S36 is executed.

As evident from the aforementioned steps S32, S33 and S35, when the key assigned for a plurality of character/symbols is continuously depressed in this embodiment, the character/symbol assigned to the key is sequentially shifted from the leftmost end rightwardly at every depression of the key, and is thus displayed on the display section 7. When the character/symbol at the rightmost end is displayed, it is again returned to the character/symbol at the leftmost end, and can be displayed on the display section 7.

The sequence of the keying operation of the case that the characters "A, B, C, D, E" in the character/symbol mode are concretely displayed on the display section 7 and the display mode of the display section 7 at every keying operation will now be described with reference to FIG. 7. This embodiment may employ keys provided on the keyboard 5 in FIG. 2.

Figure 6A:
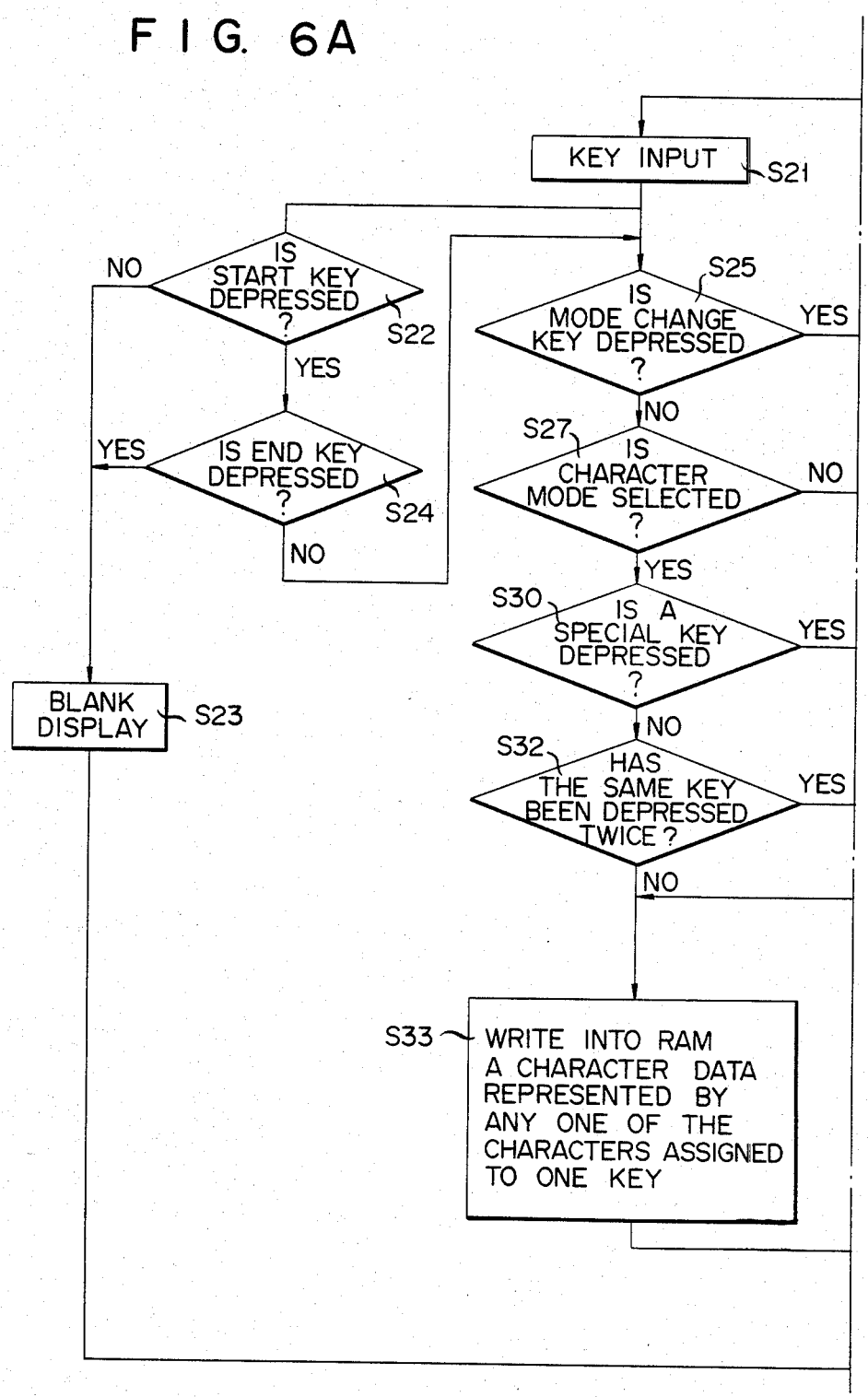
FIGS. 6A and 6B are a flowchart showing another preferred embodiment of the present invention for describing the execution of another sequence upon keying of the keyboard.
Figure 6B:
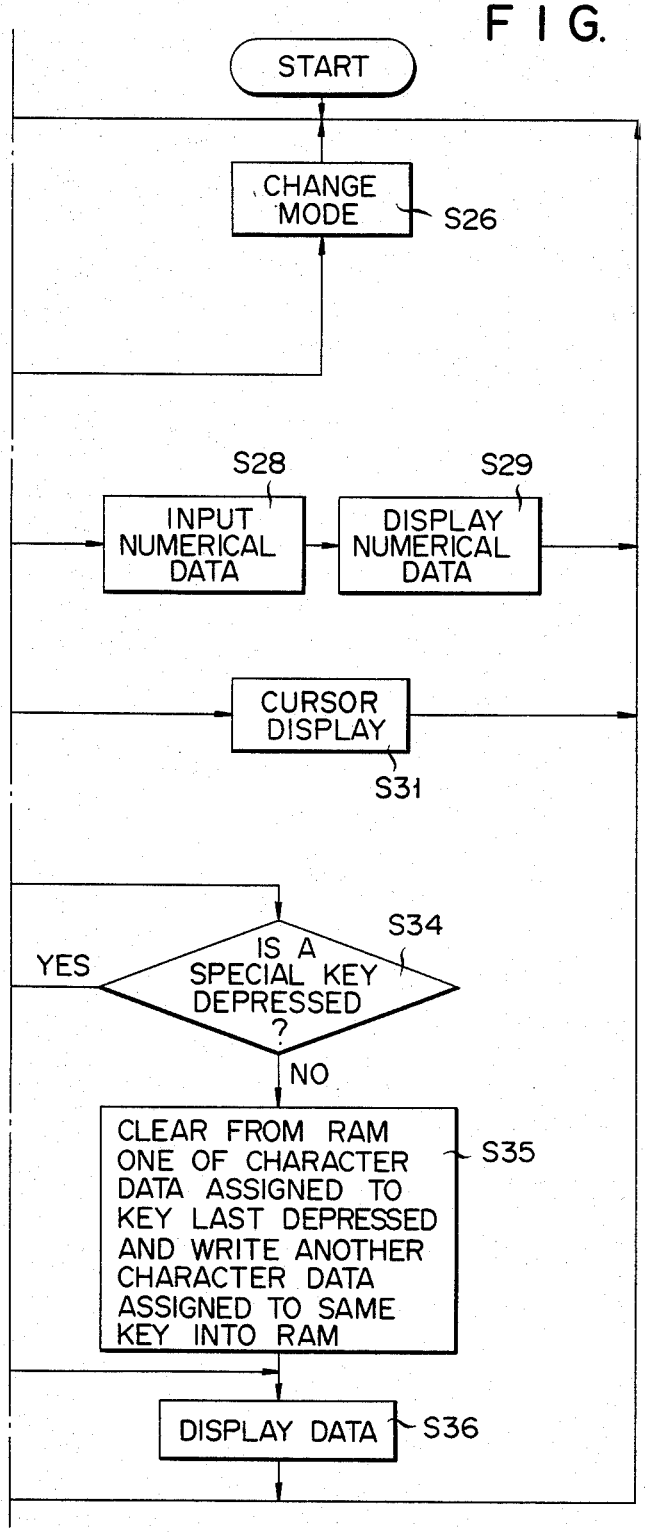

In the flow shown in FIG. 6A and 6B, when the key input is detected in the step S21, the mode change key 11 is then depressed to change to the character/symbol mode and the 2 key is thereafter depressed, the character A at the leftmost end of the characters A, B, C assigned to the 2 key is displayed on the display section 7. When the 0 key of the special key is then depressed, the displaying state of the character A remains as it is, the cursor is displayed in the display column at the rightward adjacent to the column, and "A_" is displayed on the display section 7. In order to display the character B thereafter, the 2 key assigned for the B is depressed. At this time the character A is displayed in the column displayed with the cursor consecutive to the A displayed previously on the display section 7, and "A A" is thus displayed. When the 2 key is again depressed, the character B is displayed instead of the A displayed immediately before on the display section 7, and "A B" are thus displayed. For the purpose of retaining the displaying state of the B at this time, the 0 key is depressed. Thus, while the "A B" are being displayed, the cursor is then displayed in the rightward adjacent to the B in the column. In order to input and display the C consecutively, the 2 key assigned for the C is again depressed. The character A is initially displaying in the column displayed with the cursor, and "A B A" are then displayed on the display section 7. When the 2 key is further depressed, the B is displayed instead of the A in the rightmost column, and when the 2 key is again depressed, the B is displayed instead of the C, and "A B C" are displayed on the display section 7. One useful feature of this embodiment is that as long as the next character an operator wishes to enter is on a different key, it is not necessary to press the 0 key before beginning entry of the next character. Accordingly, to input and display the D subsequently, the 3 key assigned for the D may be depressed without previous depression of the 0 key. Thus, the D is displayed in the column thus displayed with the cursor, and "A B C D" are displayed on the display section 7. I order to maintain the displaying state of the D, the 0 key is depressed. Thus, the cursor is displayed in the rightward adjacent to the D in the column, and "A B C D_" are displayed on the display section 7. To then input and display the E, the 3 key assigned for the E is depressed. The D assigned to the leftmost end of the 3 key is initially displayed in the column displayed with the cursor, and "A B C D D" are displayed on the display section 7. Subsequently, when the 3 key is again depressed, the E assigned to the 3 key is displayed instead of the D of the rightmost column, and "A B C D E" are then displayed on the display section 7. The # key of the end key is eventually depressed to display the bland, and this sequence is thus finished.

In the telephone apparatus according to the present invention, the characters previously entered can be displayed by depressing the numeral keys. Therefore, when telephone number of a party; is desired, it is possible to consecutively display the party name and telephone number. For instance, when the numerals 1 and 6 are selected as the abbreviated dial number, "LETTER" key is provided as a special key, "SATO" is assigned as a client name and inputted by the keying operation of the key assigned for the characters, and "0425 83 1111" are selected as the telephone number, "#, , 1, 6, LETTER, S, A, T, O, LETTER, 0, 4, 2, 5, 8, 3, 1, 1, 1, 1, #" are keyed as the sequence of the key input operation, and are thus stored in the RAM 38. When a plurality of client names are thus stored as intrinsic data in the RAM 38 in this manner, the telephone apparatus can be used as a telephone directory. When any of the clients is desired to read, " , 1, 6" are keyed as the abbreviated dial number, and "S, A, T, O, , 0, 4, 2, 5, 8, 3, 1, 1, 1, 1" are thus displayed on the display section 7. When "LETTER S, A, T, O" are keyed by using the special key and the client name in the keying operation at the reading time, the data is similarly read and displayed.

What we claim is:

1. A telephone apparatus capable of inputting character/symbol data comprising:

telephone network means connected to a handset and terminals connected to a telephone exchange station;

keyboard means having numeral keys each assigned to a plurality of characters/symbols and a mode switching key for switching between a numeral mode and a character/symbol, said keyboard means including a key having a switching instruction function which causes preparation for an additional character/symbol to be displayed with the next depression of one of said numeral keys;

controller means connected to the telephone network means and the keyboard and including memory means for storing keyed in data, said controller means for: (1) setting a desired mode as the mode switching key is operated, (2) selecting for display one of the character/symbols assigned to one of said numeral keys which has been depressed after said mode setting means has been set to the character/symbol mode, (3) changing the character/symbol selected for display in said function (2) to a different character/symbol associated with the same numeral key in response to each repeated depression of the same numeral key previously depressed, (4) selecting for display one of the characters/symbols assigned to another of said numeral keys which has been depressed immediately after said one numeral key, (5) preparing for an additional character/symbol to be displayed with the next depression of one of said numeral keys in response to depression of said switching instruction function key when said additional character/symbol is associated with the same one of said numeral keys as the character/symbol just entered, and (6) holding in said memory means a representation of said character/symbol selected by said functions (2)–(4); and display means, connected to said controller means, for displaying said character/symbols whose representation is stored in said memory means.

2. A telephone apparatus capable of inputting character/symbol data comprising:

telephone network means connected to a handset and terminals connected to a telephone exchange station;

keyboard means having numeral keys each assigned to a plurality of characters/symbols, and a mode switching key for switching between a numeral mode and a character/symbol mode, said keyboard means including a single key having a switching instruction function which switches, with each depression, a character/symbol being displayed in a character/symbol mode to a different character/symbol associated with the same numeral key; and controller means connected to the telephone network means and the keyboard, said controller means for: (1) setting a desired mode as the mode switching key is operated, (2) selecting for entry one of the characters/symbols assigned to one of said numeral keys which has been depressed after the mode setting means has been set to the character/symbol mode, and (3) changing the character/symbol selected for entry in said function (2) to a different character/symbol associated with the same numeral key in response to each repeated depression of said single switching instruction function key.

3. A telephone apparatus capable of inputting character/symbol data comprising:

telephone network means connected to a handset and terminals connected to a telephone exchange station;

keyboard means having numeral keys each assigned to a plurality of characters/symbols and a mode switching key for switching between a numeral mode and a character/symbol mode, said keyboard means including a key having a switching instruction function which causes preparation for an additional character/symbol to be displayed with the next depression of one of said numeral keys; and controller means connected to the telephone network means and the keyboard, said controller means for: (1) setting a desired mode as the mode switching key is operated, (2) selecting for entry one of the character/symbols assigned to one of said numeral keys which has been depressed after said mode setting means has been set to the character/symbol mode, (3) changing the character/symbol selected for entry in said function (2) to a different character/symbol associated with the same numeral key in response to each repeated depression of the same numeral key previously depressed, (4) selecting for entry one of the characters/symbols assigned to another of said numeral keys which has been depressed immediately after said one numeral key, and (5) preparing for an additional character/symbol to be entered with the next depression of one of said numeral keys in response to depression of said switching instruction function key when said additional character/symbol is associated with the same one of said numeral keys as the character/symbol just entered.

4. A telephone apparatus capable of inputting characters/symbol data comprising:

telephone network means connected to a handset and terminals connected to a telephone exchange station;

keyboard means having numeral keys each assigned to a plurality of characters/symbols and a mode switching key for switching between a numeral mode and a character/symbol mode, said keyboard means including a single key having a switching instruction function which switches, with each depression, a character/symbol being displayed in a character/symbol mode to a different character/symbol associated with the same numeral key; and controller means connected to the telephone network means and the keyboard and including memory means for storing keyed in data, said controller means for: (1) setting a desired mode as the mode switching key is operated, (2) selecting for display one of the characters/symbols assigned to one of said numeral keys which has been depressed after the mode setting means has been set to the character/symbol mode, (3) outputting a character/symbol pattern signal representing character/symbol selected, (4) holding in said memory means the character/symbol pattern signal from said outputting function (3), (5) selecting another character/symbol than the character/symbol selected by said selecting function (2), said another character/symbol being assigned to the same key, by operating the same key and then operating said single switching instruction function key, and (6) outputting a character/symbol pattern signal representing said another character/symbol selected and (7) holding in said memory means said character/symbol pattern signal from said outputting function (6); and display means connected to said controller means, for displaying said outputted character/symbol pattern signals stored in said memory means.

* * * * *